(12) United States Patent
Zhang et al.

(10) Patent No.: US 11,610,116 B2
(45) Date of Patent: Mar. 21, 2023

(54) STORAGE DEVICE PERFORMANCE OPTIMIZATION USING DEEP LEARNING

(71) Applicant: SK hynix Inc., Icheon-si (KR)

(72) Inventors: Fan Zhang, San Jose, CA (US); Yu Cai, San Jose, CA (US); Chenrong Xiong, San Jose, CA (US); Xuanxuan Lu, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 624 days.

(21) Appl. No.: 16/717,888

(22) Filed: Dec. 17, 2019

(65) Prior Publication Data

US 2020/0210831 A1     Jul. 2, 2020

Related U.S. Application Data

(60) Provisional application No. 62/787,182, filed on Dec. 31, 2018.

(51) Int. Cl.
| | |
|---|---|
| *G11C 29/00* | (2006.01) |
| *G06N 3/08* | (2023.01) |
| *G06N 3/04* | (2023.01) |
| *G06F 11/10* | (2006.01) |

(52) U.S. Cl.
CPC ........... *G06N 3/08* (2013.01); *G06F 11/1016* (2013.01); *G06N 3/04* (2013.01)

(58) Field of Classification Search
CPC ......... G06N 3/08; G06N 3/04; G06F 11/1016
See application file for complete search history.

(56) References Cited

U.S. PATENT DOCUMENTS

| 7,558,109 | B2 * | 7/2009 | Brandman ........... G11C 16/349 |
|---|---|---|---|
| | | | 365/185.28 |
| 8,370,719 | B2 | 2/2013 | Nelson et al. |
| 8,947,958 | B2 | 2/2015 | Mu et al. |
| 9,842,610 | B2 | 12/2017 | Kurata |
| 2008/0002468 | A1 | 1/2008 | Hemink |
| 2009/0003058 | A1 | 1/2009 | Kang |
| 2013/0238836 | A1 | 9/2013 | Suzuki et al. |
| 2016/0132256 | A1 | 5/2016 | Jung |
| 2017/0364798 | A1 | 12/2017 | Karlinsky et al. |
| 2018/0246782 | A1 | 8/2018 | Zeng et al. |

(Continued)

OTHER PUBLICATIONS

Sze, V. et al., "Efficient Processing of Deep Neural Networks: A Tutorial and Survey", IEEE.

*Primary Examiner* — Samir W Rizk
(74) *Attorney, Agent, or Firm* — Perkins Coie LLP

(57) ABSTRACT

Disclosed is a computer-implemented method for optimizing read thresholds of a memory device using a deep neural network engine, comprising reading, using a set of read threshold voltages applied to the memory device, data from the memory device under a first set of operating conditions that contribute to read errors in the memory device, producing a labeled training data set using the set of read threshold voltages under the first set of the operating conditions, determining, based on characteristics of the memory device, a number of layers, a size of each layer, and a number of input and output nodes of the deep neural network engine, training the deep neural network engine using the labeled training data set, and using the trained deep neural network engine to compute read thresholds voltage values under a second set of operating conditions.

20 Claims, 13 Drawing Sheets

(56) References Cited

U.S. PATENT DOCUMENTS

| | | |
|---|---|---|
| 2019/0004734 A1* | 1/2019 | Kirshenbaum ....... G06F 3/0653 |
| 2019/0172542 A1 | 6/2019 | Miladinovic |
| 2019/0180176 A1* | 6/2019 | Yudanov ................. G06N 3/08 |
| 2019/0267054 A1 | 8/2019 | Thalaimalaivanaraj et al. |
| 2019/0286516 A1 | 9/2019 | Jacobvitz et al. |
| 2020/0026470 A1 | 1/2020 | Yang |
| 2020/0027519 A1 | 1/2020 | Zhang et al. |
| 2020/0176063 A1 | 6/2020 | Malshe et al. |
| 2020/0210831 A1 | 7/2020 | Zhang et al. |
| 2021/0303474 A1 | 9/2021 | Ellis et al. |

* cited by examiner

STORAGE DEVICE PERFORMANCE OPTIMIZATION USING DEEP LEARNING

CROSS-REFERENCE TO RELATED APPLICATION

This patent document claims priority to and benefits of U.S. Provisional Patent Application No. 62/787,182 entitled "STORAGE DEVICE PERFORMANCE OPTIMIZATION USING DEEP LEARNING" and filed on Dec. 31, 2018. The entire content of the before-mentioned patent application is incorporated by reference as part of the disclosure of this patent document.

TECHNICAL FIELD

This patent document relates to semiconductor memories and data storages including the semiconductor memories.

BACKGROUND

Data storage devices containing semiconductor memories store information in an array of semiconductor memory cells. Semiconductor manufacturers continue to develop new technologies that enable high-capacity data storage devices, including three-dimensional (3D) flash memory stacking technology, which stacks multiple memory cell layers vertically, and a multi-level cell (MLC) programming technology, which enables each memory cell to store two or more bits of information. The increase in the number of bits each memory cell stores and the increase in the density of the array of the memory cells, however, may make the data storage devices more prone to errors due to dense threshold voltage distributions of the MLC memory cells and the interference between adjacent memory cells in the dense memory array.

SUMMARY

Disclosed are methods, devices and applications relating to data storage optimization technologies that use deep learning to identify specific, potential risks of threshold voltage shift that can occur in a memory cell array of a data storage device.

One or more embodiments of the disclosed technology relates to classifications of operating conditions that contribute to the read errors in flash memory-based data storage solid state drive (SSD) devices to train one or more deep learning algorithms, and then to modify read thresholds.

In an embodiment of the disclosed technology, a computer-implemented method for optimizing read thresholds of a memory device using a deep neural network engine, comprising reading, using a set of read threshold voltages applied to the memory device, data from the memory device under a first set of operating conditions that contribute to read errors in the memory device, producing a labeled training data set using the set of read threshold voltages under the first set of the operating conditions, determining, based on characteristics of the memory device, a number of layers, a size of each layer, and a number of input and output nodes of the deep neural network engine, training the deep neural network engine using the labeled training data set, and using the trained deep neural network engine to compute read thresholds voltage values under a second set of operating conditions.

In another embodiment of the disclosed technology, a computer-implemented method for optimizing read thresholds of a memory device using a deep neural network engine includes measuring, using a set of read threshold voltages applied to the memory device, data in the memory device under a first set limited combination of operating conditions that contribute to read errors in the memory device, finding proper read threshold voltages under the limited combination first set of the operating conditions to produce a labeled training data set, deciding, based on characteristics of the memory device, a number of layers and a size of each layer for the deep neural network engine, configuring layers and input and output nodes of the deep neural network engine, training the deep neural network engine using the labeled training data set, and using the trained deep neural network engine to compute read thresholds voltage values under, based on a larger a second set of operating conditions, a set of read threshold values to produce an optimal performance of the memory device.

In another embodiment of the disclosed technology, a system includes a memory to store executable instructions for optimizing read threshold voltages of memory devices in a data storage system, and a processor in communication with the memory to read the executable instructions from the memory to read, using a set of read threshold voltages applied to the memory device, data from the memory device under a first set of operating conditions that contribute to read errors in the memory device, produce a labeled training data set using the set of read threshold voltages under the first set of the operating conditions, determine, based on characteristics of the memory device, a number of layers, a size of each layer, and a number of input and output nodes of the deep neural network engine, train the deep neural network engine using the labeled training data set, and use the trained deep neural network engine to compute read thresholds voltage values under a second set of operating conditions.

In another embodiment of the disclosed technology, a system includes a memory to store executable instructions for optimizing read threshold voltages of memory devices in a data storage system, and a processor in communication with the memory to read the executable instructions from the memory to measure, using a set of read threshold voltages applied to the memory devices, data in the memory devices under a first set of operating conditions that contribute to read errors in the memory devices, find read threshold voltages under the first set of operating conditions to produce a labeled training data set, decide, based on characteristics of the memory device, a number of layers and a size of each layer for the deep neural network engine, configure layers and input and output nodes of the deep neural network engine, train the deep neural network engine using the labeled training data set, and use the trained deep neural network engine to compute read thresholds voltage values under a second set of operating conditions.

In an embodiment of the disclosed technology, a computer-implemented method for optimizing read thresholds of a memory device using a deep neural network engine includes measuring, using a set of read threshold voltages applied to the memory device, data in the memory device under a limited combination of operating conditions that contribute to read errors in the memory device, finding proper read thresholds under the limited combination of the operating conditions to produce a labeled training data set, deciding, based on characteristics of the memory device, a number of layers and a size of each layer for the deep neural network engine, configuring layers and input and output nodes of the deep neural network engine, training the deep neural network engine using the labeled training data set, and using the trained deep neural network engine to compute, based on a larger set of operating conditions, a set of read threshold values to produce an optimal performance of the memory device.

In another embodiment of the disclosed technology, a system includes a memory to store executable instructions for optimizing read threshold voltages of memory devices in a data storage system, and a processor in communication with the memory to read the executable instructions from the memory to measure, using a set of read threshold voltages applied to the memory devices, data in the memory device under a limited combination of operating conditions that contribute to read errors in the memory devices, find proper read threshold voltages under the limited combination of operating conditions to produce a labeled training data set, decide, based on characteristics of the memory device, a number of layers and a size of each layer for the deep neural network engine, configure layers and input and output nodes of the deep neural network engine, train the deep neural network engine using the labeled training data set, and use the trained deep neural network engine to compute, based on a larger set of operating conditions, a set of read threshold values to produce an optimal performance of the memory devices.

The subject matter described in this patent document can be implemented in specific ways that provide one or more of the following features.

DETAILED DESCRIPTION

In the context of this patent document, the words optimal, optimized or optimum that are used in conjunction with threshold values or the memory system performance to indicate values or conditions that provide a better performance for the memory device (e.g., higher reliability, fewer detected errors, etc.) than existing threshold values or conditions. In this sense, the words optimum, optimized or optimal may or may not convey the best possible performance achievable by the memory device.

Figure 1:
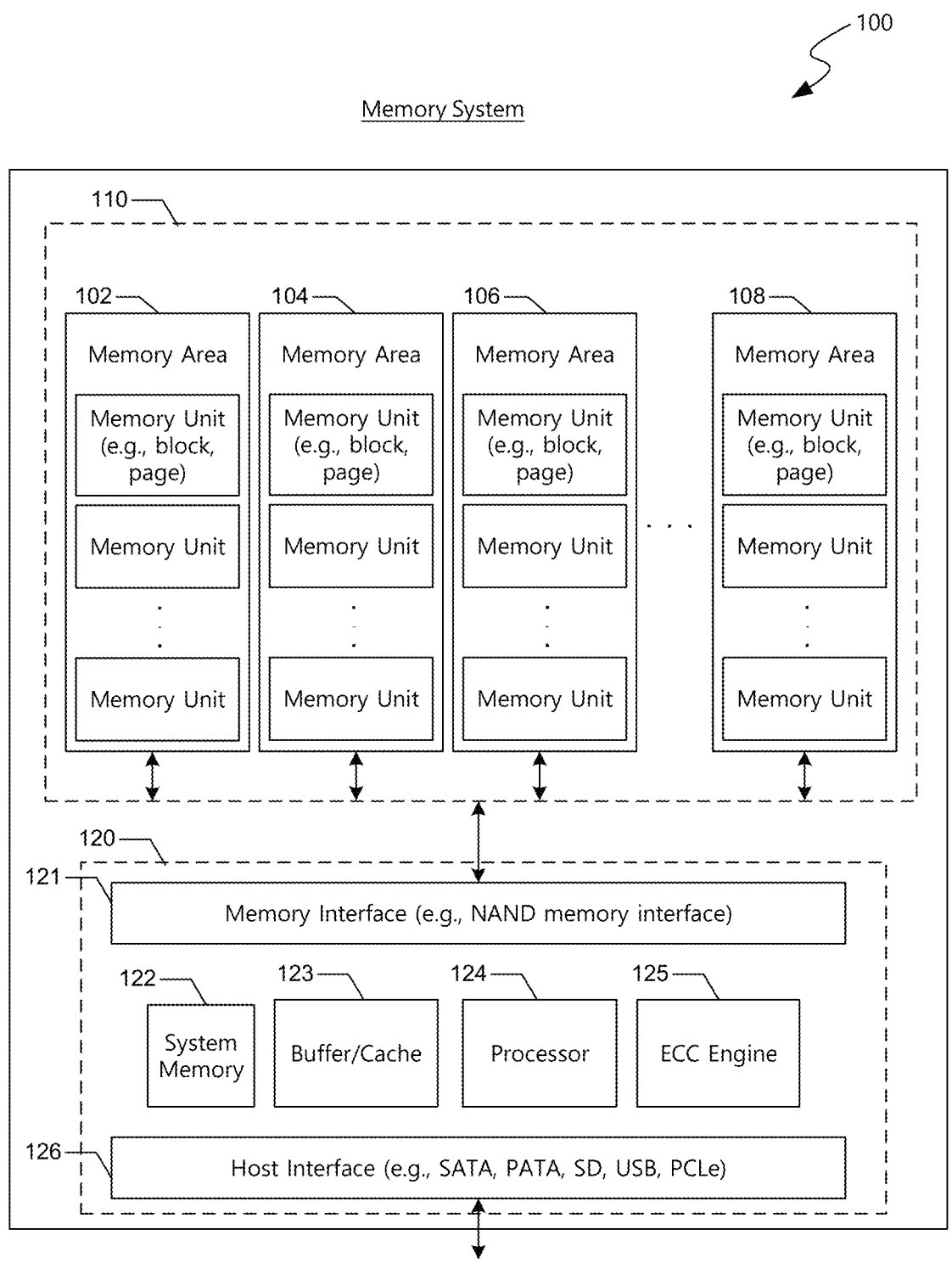
FIG. 1 is a block diagram of an example of a memory system implemented based on some embodiments of the disclosed technology.

FIG. 1 is a block diagram of an example of a memory system 100 that can be implemented in some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
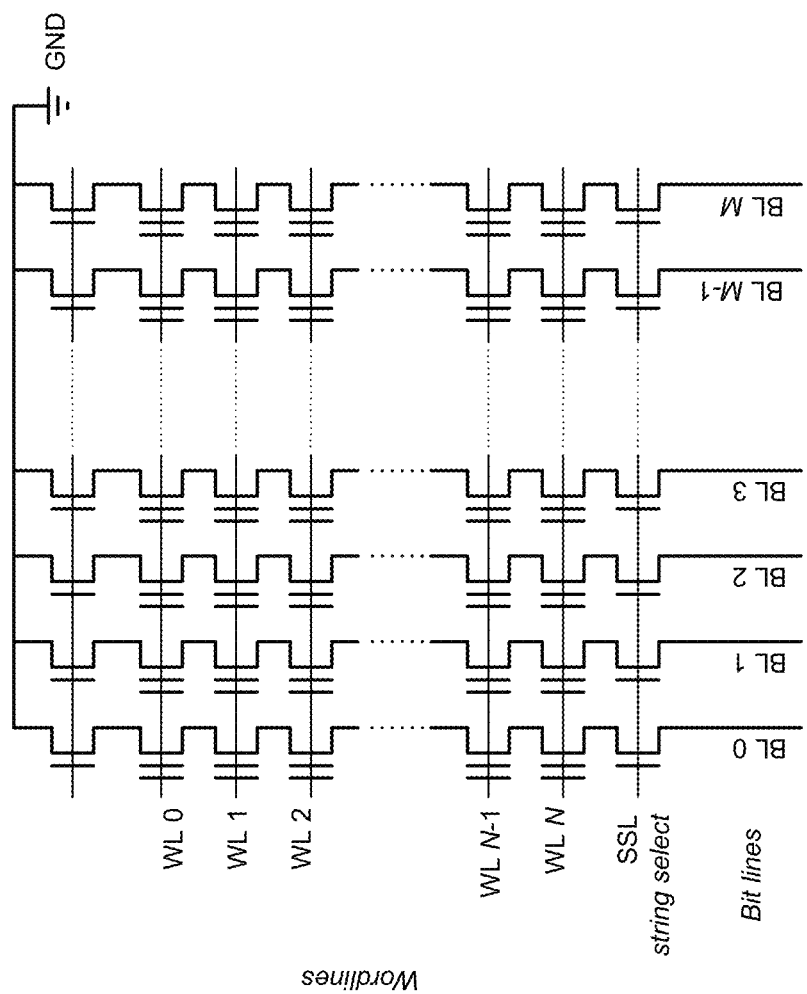
FIG. 2 illustrates an example of a memory cell array implemented based on some embodiments of the disclosed technology.

FIG. 2 illustrates an example of a memory cell array implemented can be used in some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

In the MLC technology, each memory cell can be programmed to belong to one of multiple distributions of the threshold voltage level. In an ideal case, the threshold voltage value of each memory cell corresponds to a non-overlapping threshold voltage distribution window. Given certain memory cells are programmed to the same value, threshold voltages of transistors of those memory cells fall into the same threshold voltage distribution window, although their exact threshold voltages could be different.

Figure 3:
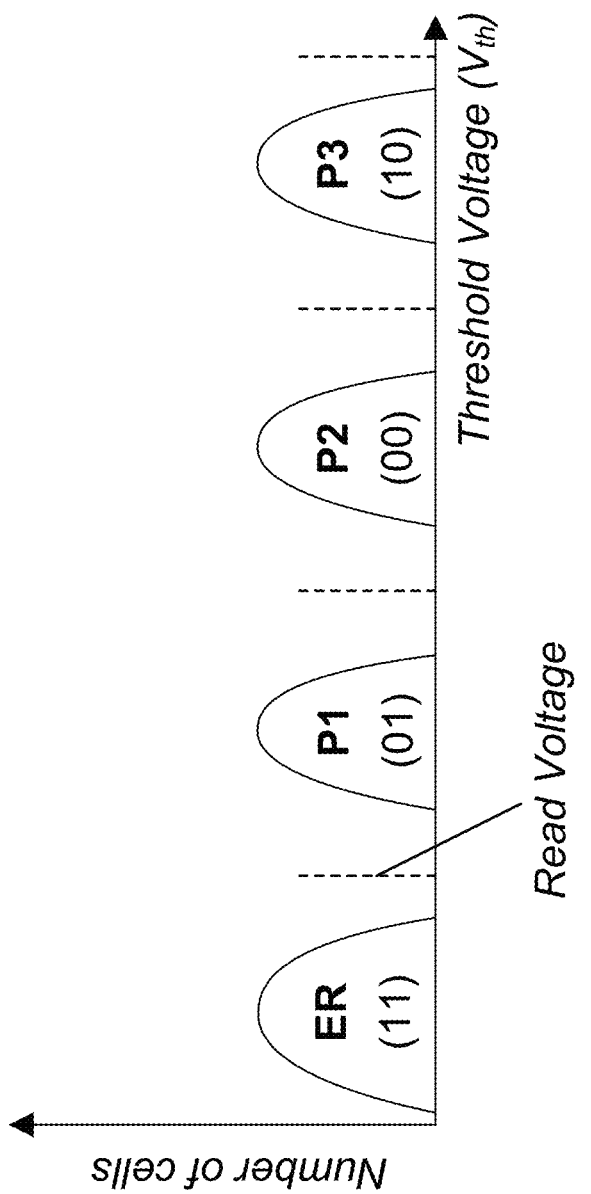
FIG. 3 illustrates an example of threshold voltage distribution curves in a multi-level cell device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

When a read operation is performed on the memory array using a certain voltage reference value such as a read threshold (i.e., read voltage level), the electrical charge levels of the memory cells (e.g., threshold voltage levels of transistors of memory cells) are compared to one or more voltage reference values (also called "read voltage level" or "read threshold") to determine the state of individual memory cells. When a certain read threshold is applied to the memory array, those memory cells that have threshold voltage levels higher than the certain voltage reference value are turned on and detected as "on" cell, whereas those memory cells that have threshold voltage levels lower than the certain voltage reference value are turned off and detected as "off" cell, for example. Therefore, each read threshold is arranged between neighboring threshold voltage distribution windows corresponding to different programmed states so that each read threshold can distinguish such programmed states by turning on or off the memory cell transistors.

When a read operation is performed on memory cells in a data storage device using the MLC technology, the threshold voltage levels of the memory cells are compared to more than one read threshold level to determine the state of individual memory cells. Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors. For example, as program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using error correction codes (ECC). When the number of bit errors on a read operation exceeds the ECC correction capability of the data storage, the read operation fails.

Certain circumstances or operations conditions, such as charge leakage over time and device wear caused by usage, can cause a threshold voltages shift. Such a threshold voltage shift can produce read errors because, for example, several "off" cells may result in a threshold voltage higher than the read threshold due to the threshold voltage shift. Various circumstances can cause the threshold voltage shift producing read errors. For example, memory devices with low endurance can produce more read errors than those with high endurance. Such a threshold voltage shift can be induced by operating conditions such as increased number of program/erase cycle of the memory array and an operating temperature of the data storage devices. A read disturbance and the location of a memory chip or memory block may also be considered to determine whether the threshold voltage shift is likely to occur.

The endurance of flash memories may be represented by the maximum amount of program/erase operations that the flash memories are guaranteed to be able to perform program/erase operations successfully. Each memory cell can only be programmed and erased a very limited number of times, before it becomes potentially unusable. In some embodiments of the disclosed technology, the endurance of flash memories can be represented by the maximum iteration of program/erase operations per day. The endurance of the flash memories can be affected by structural issues such as high memory densities and operating conditions such as high program voltages.

The data retention may refer to an operating condition relating to how long memory cells maintain a correct programmed state. The data retention can vary depending on the operating temperature and the number of program/erase cycles. A high temperature and a large iterations of program/erase operations tend to degrade data retention in certain circumstances.

The read disturbance indicates a phenomenon where reading data from a flash cell can cause the threshold voltages of other unread cells in the same block to shift to a different (e.g., higher) value. While a single threshold voltage shift is small, when read operations are performed over time, the threshold voltage shift eventually becomes large enough to alter the state of the memory cells.

Figure 4:
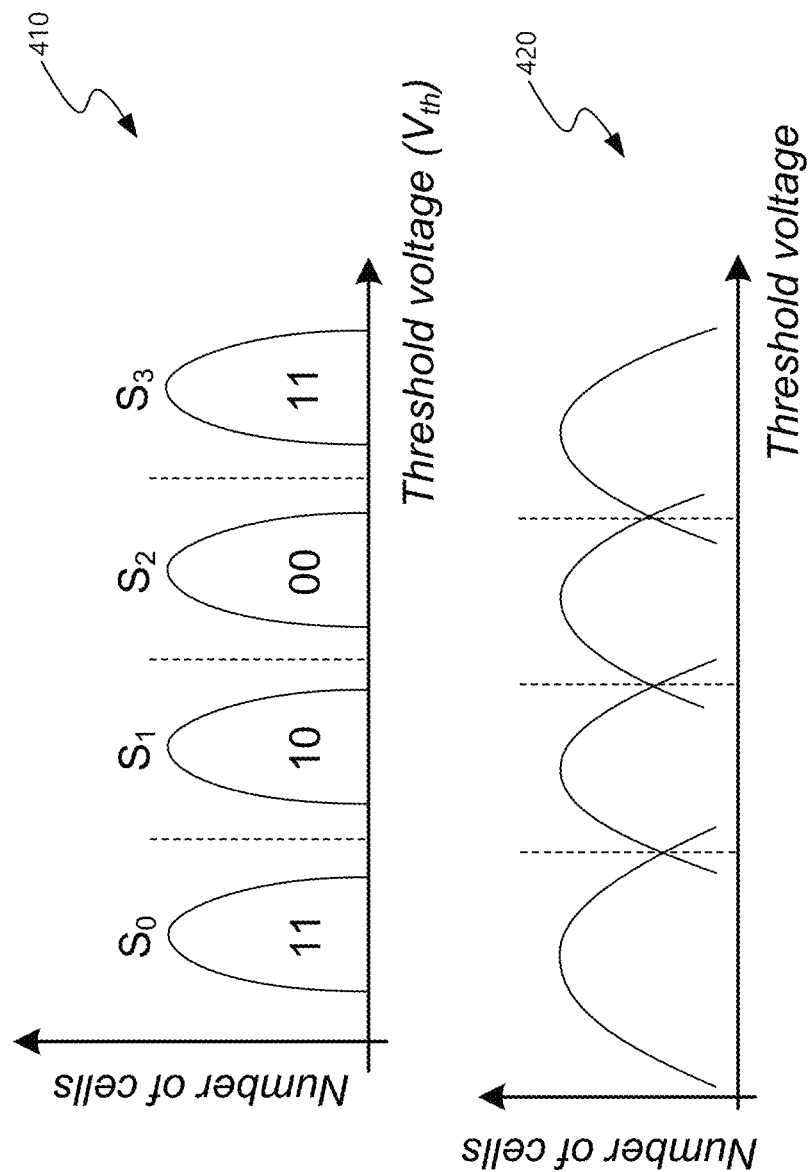
FIG. 4 illustrates an example of ideal threshold voltage distribution curves and an example of distorted threshold voltage distribution curves.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
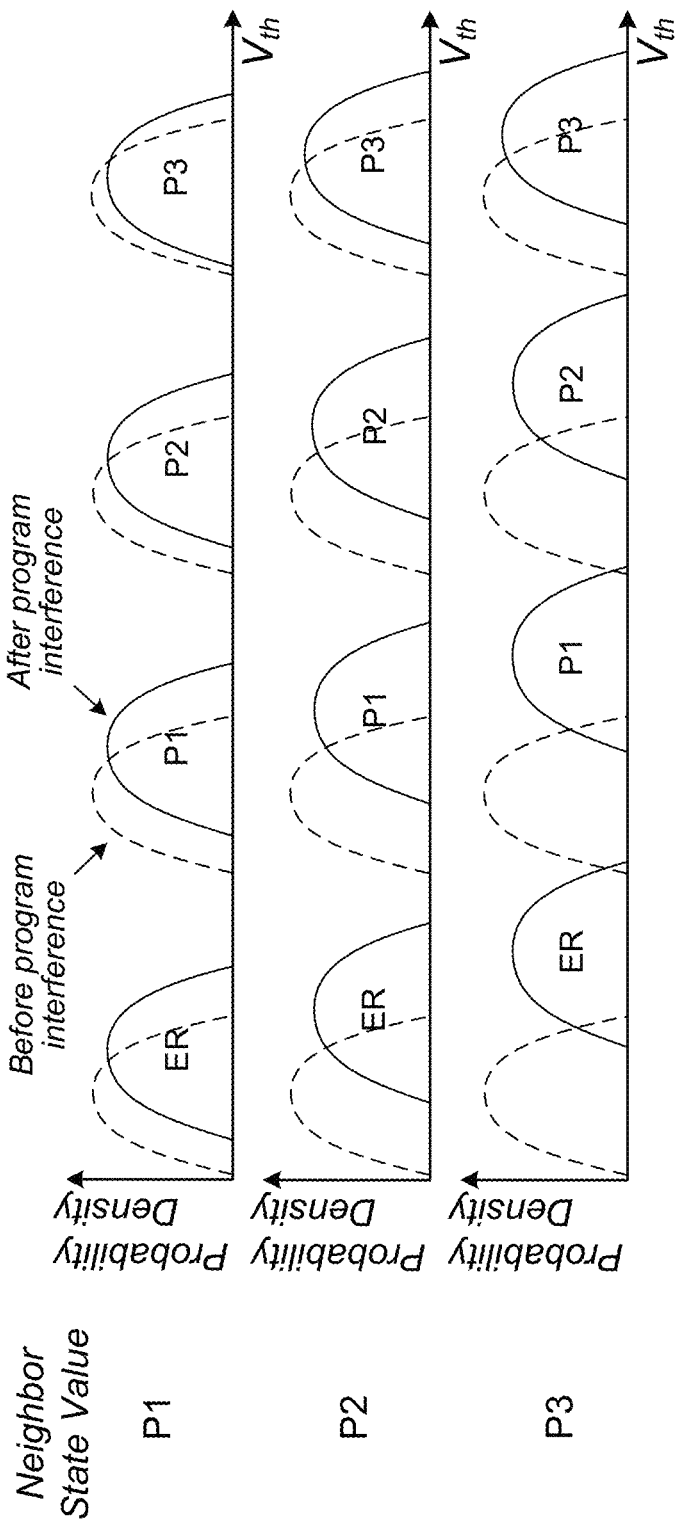
FIG. 5 illustrates an example of a cell-to-cell interference in NAND flash memory.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell inference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
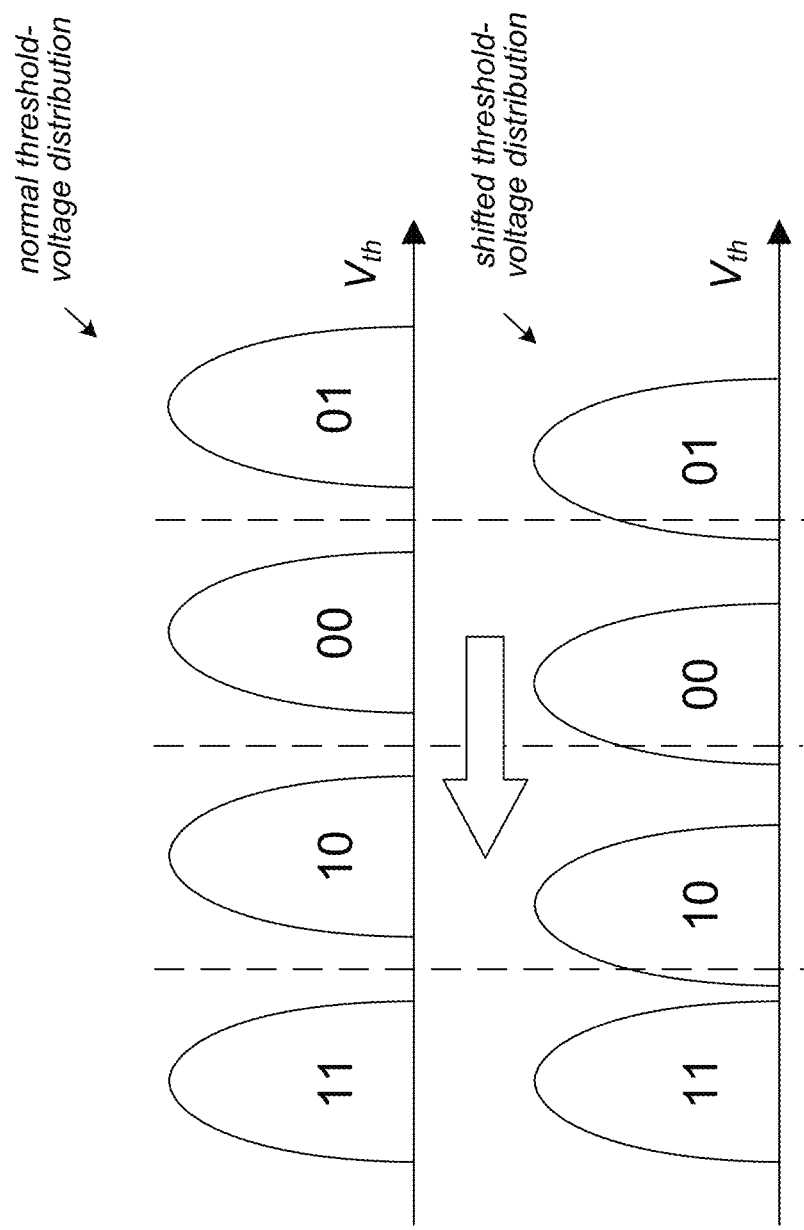
FIG. 6 illustrates an example of a retention error in NAND flash memory by comparing normal threshold-voltage distribution and shifted threshold-voltage distribution.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

The die indices, block indices, and word line indices can represent the physical location of the memory cell to be read. A data storage device can be made up of a plurality of memory chip dies, each including a plurality of memory blocks. Each memory block includes a plurality of memory cells, and each memory cell can be selected by a word line coupled thereto. A memory controller can be configured to track movement of data across the plurality of dies and the plurality of blocks. Based on the movement of data, the memory controller can determine how many times a certain memory die or a certain memory block has performed program/erase operations. This information can be stored according to die indices, block indices, and word line indices. For example, if program/erase operations are concentrated on a certain location of the data storage device, the possibility of read errors would be higher when reading out data from that location.

Such read errors, however, can be minimized by modifying the read thresholds. In some embodiments of the disclosed technology, the read thresholds may be modified based on operating conditions that contribute to the read errors in flash memory-based data storage SSD devices. These operating conditions include, but are not limited to, the endurance of memory devices, the data retention, the read disturbance, the age of the storage device, the operating temperature of data storage devices, and the location of the memory cell to be read, which can be indicated by die indices, block indices, and/or word line indices.

The performance (e.g., input/output operations per second and throughput) of a data storage device such as an SSD is heavily dependent on the read threshold setting (i.e., read voltage setting) applied when the first read operation is conducted. If the read threshold is not optimized, the performance may be degraded because such unoptimized read threshold voltages can cause read errors. The optimization of the read threshold voltages depends on certain operating conditions such as physical location of data, device endurance, data retention time, operating temperature, read disturbance, and age of device. However, it is unrealistic to manually consider all the possible combinations of different operating conditions to modify the read thresholds. It would be even more difficult to manually obtain an optimized read threshold if the operating conditions have continuous values.

In some embodiments of the disclosed technology, the read errors can be minimized by using a deep neural network to identify specific effects of threshold voltage shift that can occur in a memory cell array of a data storage device based on the operating conditions discussed above. In some implementations of the disclosed technology operating conditions that contribute to the threshold voltage shifts, which can result in the read errors, are classified and such operating conditions are quantified using a deep neural network. Some implementations of the disclosed technology include identifying criteria that must be met to set a read threshold at a certain value. For example, when it is determined that the criteria for the optimal read threshold is not met (e.g., when the number of errors or indication of errors from the memory device approaches an undesirably high value, a temperature value approaches a low or a high threshold value, etc.), a memory controller can obtain new values to modify the read thresholds based on the sensed operating conditions using the values that is generated by the deep learning neural network engine. The operating conditions, including a physical location of data, an endurance of the data storage device, data retention, an operating temperature, a read disturbance, and the age of the data storage device, can be used to estimate or predict the threshold voltage shift. The deep neural network may be trained based on input data collected from a large number of flash memory chip dies. For example, the deep neural network can be trained based on a limited combination of operating conditions. In an implementation, optimized read threshold voltages are computed from the trained deep neural network engine. In another implementation, the values obtained by the trained neural network engine may be stored in a memory (e.g., a lookup table) of a data storage device, and a memory controller in the data storage device may modify the read threshold voltages based on the values.

In some embodiments of the disclosed technology, a deep neural network is used to predict the optimal read threshold from the operating conditions of the storage device. In one example, the deep learning network can be used to interpolate the optimal read thresholds associated with operating conditions that do not exist in the training data set obtained from the offline memory device characterization. In some embodiments of the disclosed technology, a trained deep neural network for optimizing read threshold voltages can be obtained from an offline computing process based on a limited combination of operating conditions. Based on a larger set of operating conditions, the optimal read thresholds for all possible combinations of operating conditions can be computed by the trained deep learning network so that the optimization results may be used during actual read operations of the memory device.

Figure 7:
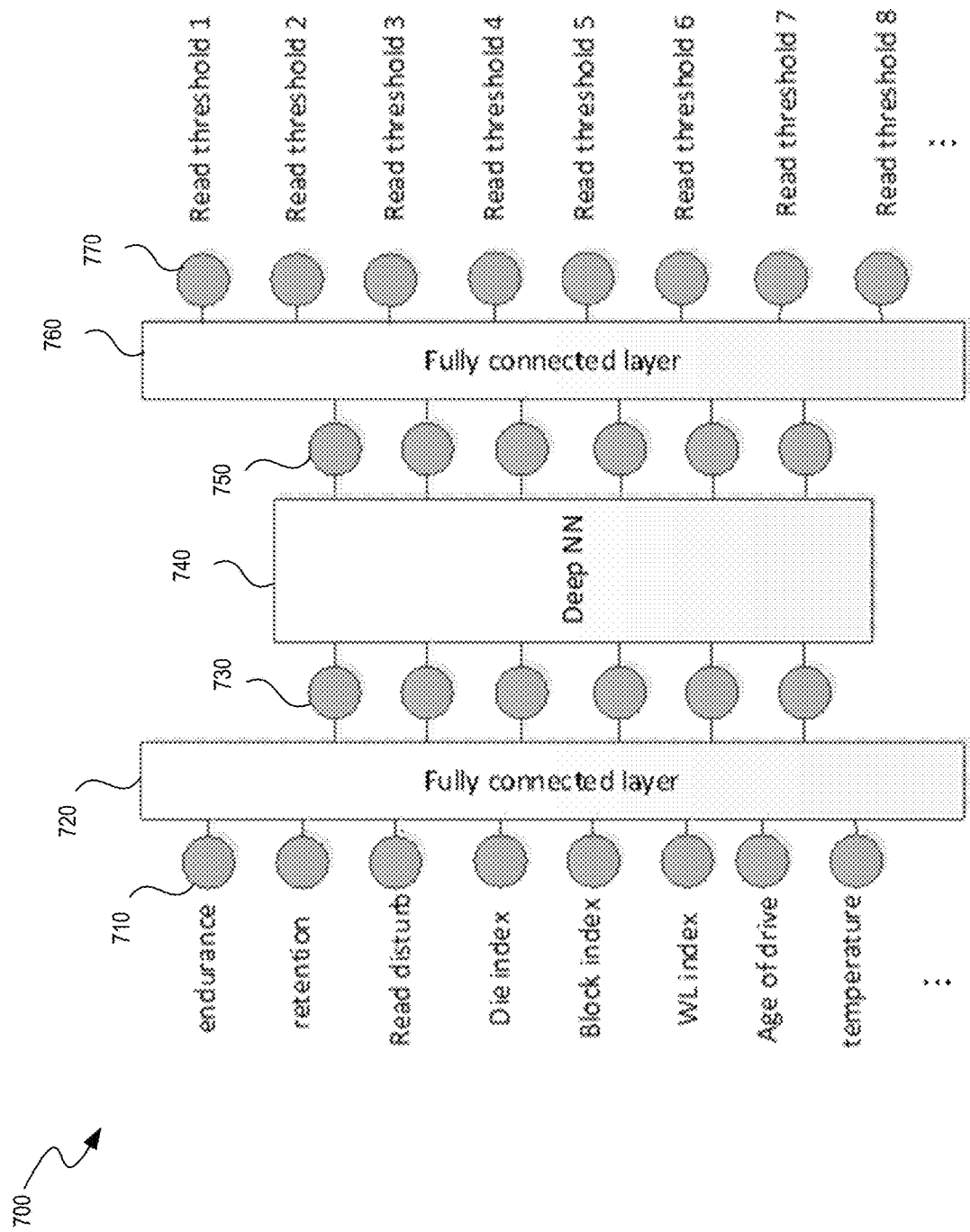
FIG. 7 illustrates an example of a deep neural network architecture for data storage performance optimization implemented based on some embodiments of the disclosed technology.

FIG. 7 illustrates an example of a deep neural network architecture for data storage performance optimization implemented based on some embodiments of the disclosed technology. The deep neural network architecture 700 for data storage performance optimization includes a plurality of input nodes 710, first and second connection layers 720 and 760, a plurality of connection nodes 730 and 750, and a deep neural network 740, and a plurality of output nodes 770. Here, the first and second connection layers 720 and 760 may be fully connected layers. For example, the first connection layer 720 may be configured to connect all the input nodes 710 to all the connection nodes 730 of the deep neural network 740. Likewise, the second connection layer 760 may be configured to connect all the output nodes 770 to all the connection nodes 750 of the deep neural network 740. In some embodiments of the disclosed technology, the input and output nodes 710 and may be input neurons and output neurons, and the first and second connection layers 720 and 760 may be synapse layers, as will be discussed below.

The already-trained deep neural network 740, through the plurality of input nodes 710, the first connection layer 720, and the first connection nodes 730, receives the operating conditions that contribute to the read errors, such as endurance, retention, read disturbance, die index, block index, word line index, age of the data storage drive, and/or temperature. The deep neural network 740 measures data in the memory devices under combinations of operating conditions using a set of read thresholds. For example, the deep neural network 740 may read out data from a certain memory cell of the data storage device under the combination of the operating conditions, including the endurance of the memory device the certain memory cell belongs to, the data retention of the memory device the certain memory cell belongs to, an expected read disturbance associated with the certain memory cell, the age of the data storage, the operating temperature of the data storage, and the physical location of the certain memory cell, which can be determined based on the die index, the block index, and the word line index. For operating conditions with continuous values, some implementation examples of the disclosed deep neural network only select or extract discrete values. In this way, the optimal read threshold can be obtained from the already-trained deep neural network. In an implementation, the thresholds voltages optimized corresponding to each combination of operating conditions may be stored in a memory (e.g., SRAM) of the storage device.

Figure 8:
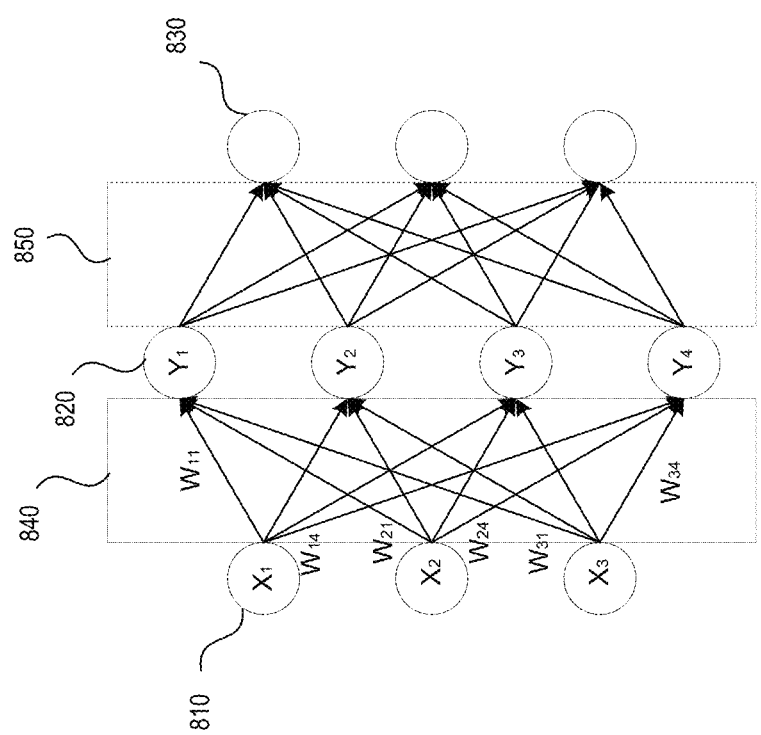
FIG. 8 illustrates an example configuration of a computational neural network including input neurons, hidden neurons, output neurons, and synapse layers.

FIG. 8 illustrates an example configuration of a computational neural network including input neurons 810, hidden neurons 820, output neurons 830, and synapse layers 840 and 850. For example, the synapse layer 840 may include a plurality of weights $W_{11}$, $W_{12}$, $W_{13}$, $W_{14}$, $W_{21}$, $W_{22}$, $W_{23}$, $W_{24}$, $W_{31}$, $W_{32}$, $W_{33}$, and $W_{34}$. The input neurons 810 receive some values and propagate them to the hidden neurons 820 of the network. The weighted sums from one or more layers of hidden neurons 820 are ultimately propagated to the output neurons 830. Here, the outputs of the neurons are often referred to as activations, and the synapses are often referred to as weights. An example of the computation at each layer can be expressed as:

$$Yj = f(\Sigma_{i=1}^{3} Wij = Xi + b) \quad \text{(Eq. 1)}$$

where Wji, Xi and Yj are the weights, input activations and output activations, respectively.

In some embodiments of the disclosed technology, input parameters such as endurance, retention, read disturbance, die index, block index, word line index, age of the data storage drive, and temperature are fed into the first layer of a deep neural network, and the outputs of that layer can be interpreted as representing the presence of different features that contribute to the threshold voltage shifts. At subsequent layers, these features are then combined into a measure of the likely presence of higher level features, which are further combined to provide a probability that these high-level features require read threshold modifications.

In some embodiments of the disclosed technology, the neural network algorithm for data storage performance optimization includes determining the value of the weights (and bias) in the neural network and is referred to as training the network. Once trained, the program can perform its task by computing the output of the neural network using the weights determined during the training process. Running the program with these weights is referred to as inference. There are multiple ways to train the weights. A supervised learning is an approach where all the training samples are labeled. Unsupervised learning is another approach where all the training samples are not labeled and essentially the goal is to find the structure or clusters in the data. A semi-supervised learning falls in between the two approaches where only a small subset of the training data is labeled.

Figure 9:
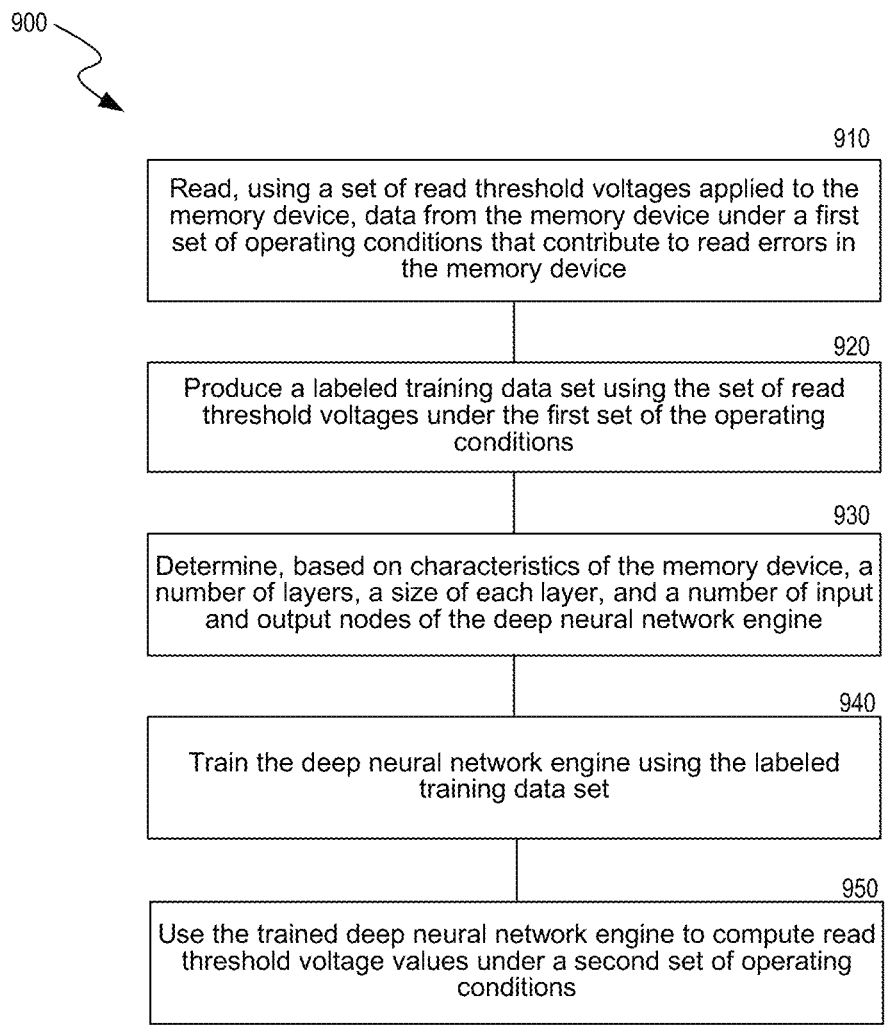
FIG. 9 illustrates an example of a training method of the deep neural network for data storage optimization implemented based on some embodiments of the disclosed technology.

FIG. 9 illustrates an example of a training method 900 of the deep neural network for data storage optimization implemented based on some embodiments of the disclosed technology. First, where the operating conditions have continuous values, discrete values are selected out of continuous values of operating conditions that contribute to the read errors in the data storage devices. At step 910, data in the memory devices are read out under certain combinations of operating conditions using a first set of read threshold voltages. For example, threshold voltages of memory cells of the memory device are measured under certain combinations of operating conditions using the first set of read threshold voltages. In an implementation, threshold voltages of memory cells are measured under certain combinations of discrete values of operating conditions using a set of read thresholds. At step 920, proper read thresholds are found to produce a labeled training data set. At step 930, the number of layers and the size of each layer are determined to construct a deep neural network engine based on characteristics of the memory device. For example, the number of layers and the size of each layer are decided as hyperparameters of a deep neural network engine. Some examples of the deep neural network engine may include at least two layers, N input nodes, and M output nodes. Here, N is the number of conditions considered and M is the number of different read threshold settings considered. The number of layers and size of each layer depends on the characteristics of the memory cell. Upon determination of the number of layers and size of each layer, layers and input/output nodes of the deep neural network engine are configured. At step 940, the deep neural network engine is trained using the labeled training data set corresponding to optimal read thresholds. At step 950, the trained deep neural network engine is used to compute read thresholds voltage values under a larger set of operating conditions.

In some embodiments of the disclosed technology, a deep neural network engine for data storage performance optimization can be designed to help identify the most influential operating conditions in determining the amount of threshold voltage shift to select an optimized read threshold for a given threshold voltage distribution windows. Based on these features, machine learning techniques can be utilized to decide the optimized read threshold, minimizing the read errors. In an implementation, the optimized read thresholds associated with the labeled training data set can be stored in a memory (e.g., SRAM) in the storage device.

Figure 10:
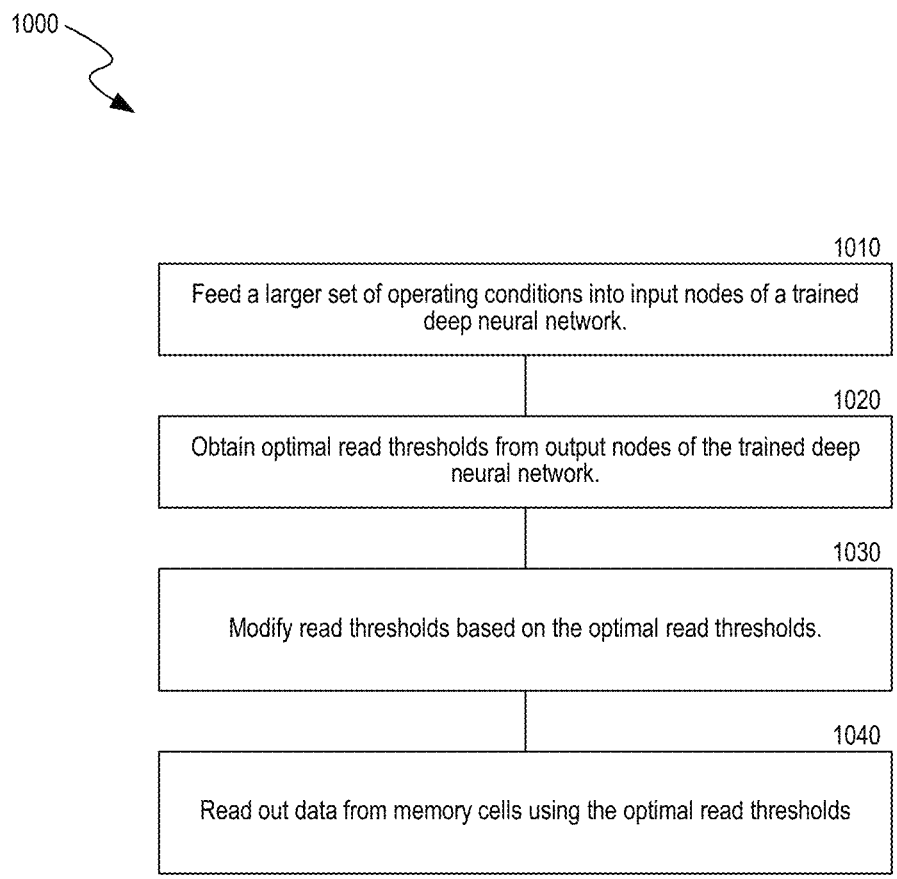
FIG. 10 illustrates an example of an inference method of the deep neural network for data storage optimization implemented based on some embodiments of the disclosed technology.

FIG. 10 illustrates an example of an inference method 1000 of the deep neural network for data storage optimization implemented based on some embodiments of the disclosed technology. At step 1010, the current operating conditions are fed into the input nodes of the trained deep neural network. At step 1020, the optimal read thresholds are obtained from output nodes of the trained deep neural network. At step 1030, read thresholds are modified to the optimal read thresholds. At step 1040, data can be read out from the memory cell using the optimal read thresholds.

Figure 11:
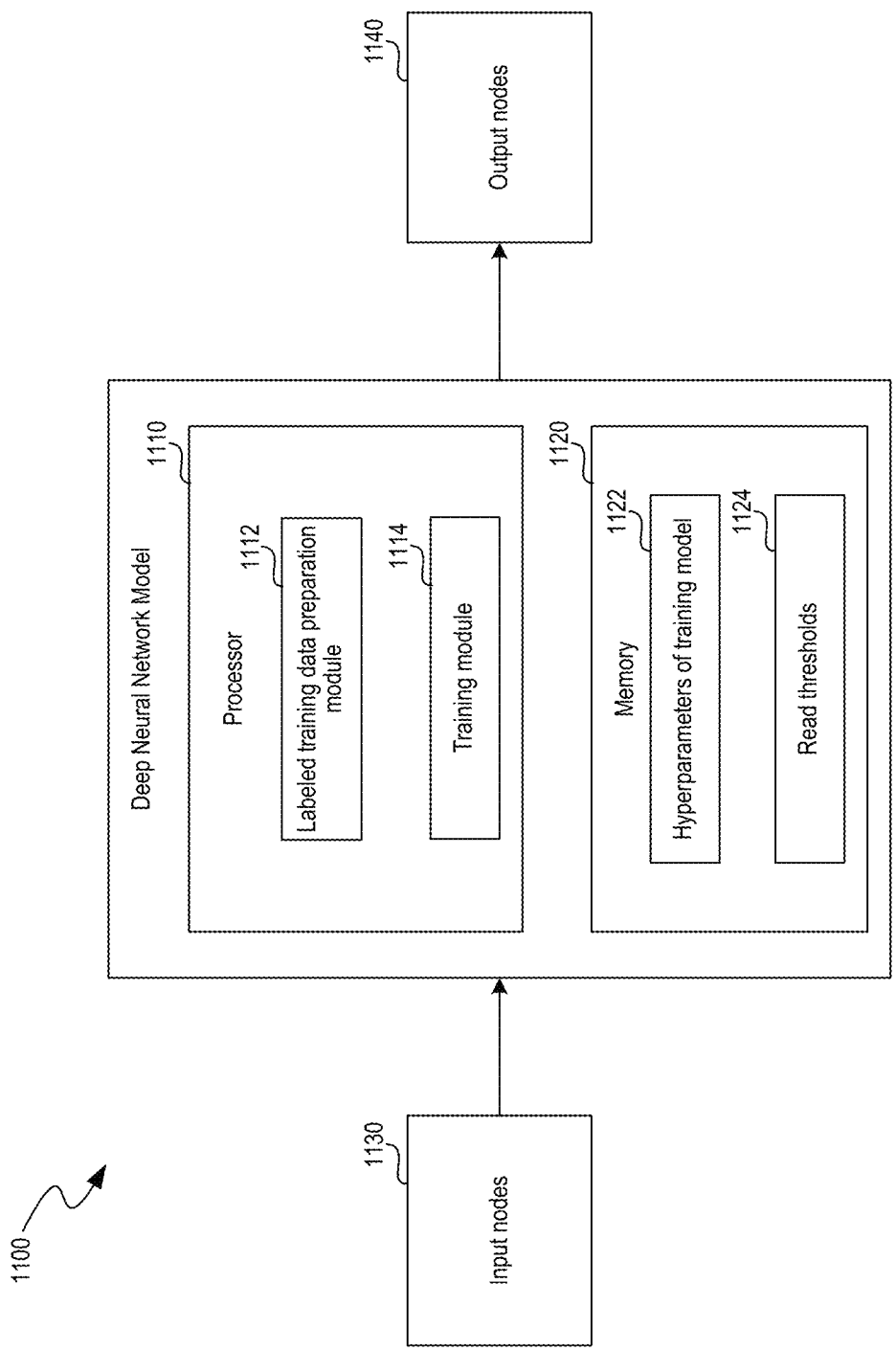
FIG. 11 illustrates an example of a deep neural network system for data storage optimization implemented based on some embodiments of the disclosed technology.

FIG. 11 illustrates an example of a deep neural network system 1100 for data storage optimization implemented based on some embodiments of the disclosed technology. The deep neural network 1100 may include one or more processors 1110 and one or more memory devices 1120 operatively coupled to the one or more processors 1110. One or more of the processors 1110 may be operable to receive a plurality of operating conditions that contribute to the read errors in the data storage devices. Some of the operating conditions that contribute to the read errors include endurance, retention, read disturbance, die index, block index, word line index, age of the data storage drive, and operating temperature. One or more of the processors 1110 may be operable to predict the optimal read threshold from the operating conditions of the storage device. For example, one or more of the processors may utilize a deep learning algorithm to interpolate the optimal read thresholds associated with operating conditions that do not exist in the training data set obtained from the offline memory device characterization.

In some embodiments of the disclosed technology, one or more of the processors 1110 may be operable to measure a threshold voltage of a memory cell under certain combinations of operating conditions. One or more of the processors 1110 may be operable to find an optimal read threshold for each threshold voltage distribution to produce a labeled training data set. In one example, one or more of the processors 1110 may include a labeled training data preparation module 1112 configured to produce the labeled training data set. One or more of the processors 1110 may be operable to configure input nodes 1130 to receive and output nodes 1140. For example, one or more of the processors 1110 may be operable to configure N input nodes and M output nodes, where N is the number of operating conditions considered and M is the number of different read threshold settings considered. One or more of the processors 1110 may be operable to decide hyperparameters of the deep neural network. One or more of the processors may be operable to train based on the labeled training data set. In one example, one or more of the processors 1110 may include a training module 1114 configured to train based on the labeled training data set. In some embodiments of the disclosed technology, one or more of the memory devices 1120 may be configured to store a set of hyperparameters of a training model 1122 and read thresholds 1124.

One or more of the processors 1110 may be operable to obtain, from the output nodes, the optimal read thresholds corresponding to the combinations of the operating conditions fed to the input nodes. The optimal read thresholds and their corresponding combinations of the operating conditions may be used to compute optimal thresholds voltages of the memory devices in the data storage device. In an implementation, the data storage device is operable to decide the read thresholds using the trained deep neural network engine.

Figure 12:
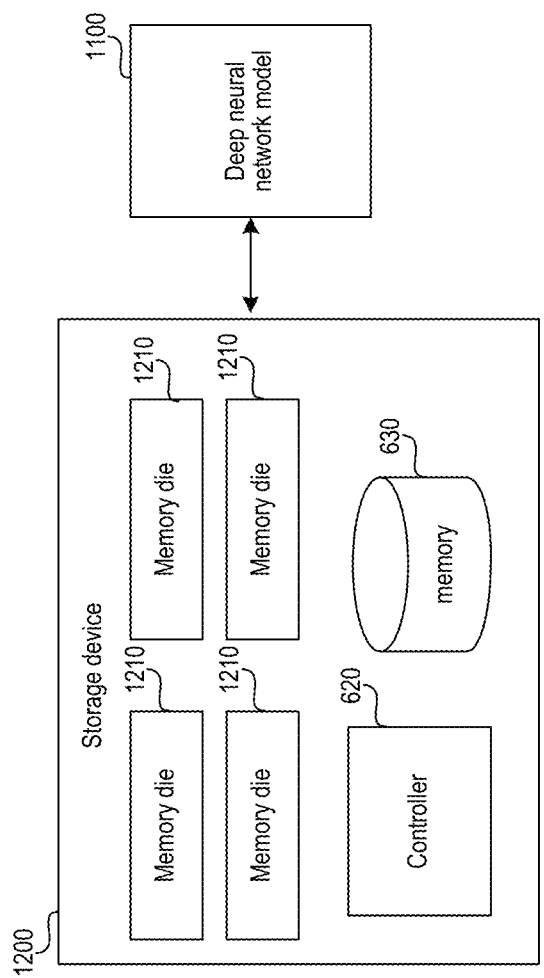
FIG. 12 illustrates an example of a data storage device implemented based on some embodiments of the disclosed technology.

FIG. 12 illustrates an example of a data storage device 1200 implemented based on some embodiments of the disclosed technology. The data storage device 1200 may include a plurality of memory dies 1210, a controller 1220, and a memory 1230. Some examples of the data storage device include a solid-state drive (SSD), which is a data storage device that utilizes non-volatile memories (e.g., flash memory) and/or volatile memories (e.g., synchronous dynamic random access memory; SDRAM) to store data. For example, the data storage device 1100 may include a plurality of flash memory devices using multi-level cell technology. Each memory device includes a plurality of memory blocks, and each of the plurality of memory block includes a plurality of memory cells. Each memory cell can be programmed into one of a plurality of program states. The data stored in each memory cell can be read out using a plurality of read thresholds. The data storage device implemented based on some embodiments of the disclosed technology is configured to ensure that the data can be read out using optimized read thresholds. Thus, the data storage device may use optimized read thresholds by mapping the operating conditions of each memory die 1210 to the optimized read thresholds.

The optimized thresholds voltages may be obtained by using the trained deep neural network implemented based on some embodiments of the disclosed technology. For example, the optimal read thresholds for all possible combinations of operating conditions may be obtained by applying, to the trained deep neural network engine, a larger set of operating conditions including the endurance of memory dies, the data retention, the read disturbance, the age of the storage device, the operating temperature of data storage devices, and the location of the memory cell to be read, which can be indicated by die indices, block indices, and/or word line indices. In an embodiment of the disclosed technology, the optimal thresholds voltages may be computed by an offline deep learning network. In an implementation, a memory in the data storage device may store the optimized read thresholds to be used during actual read operations of the data storage device.

Figure 13:
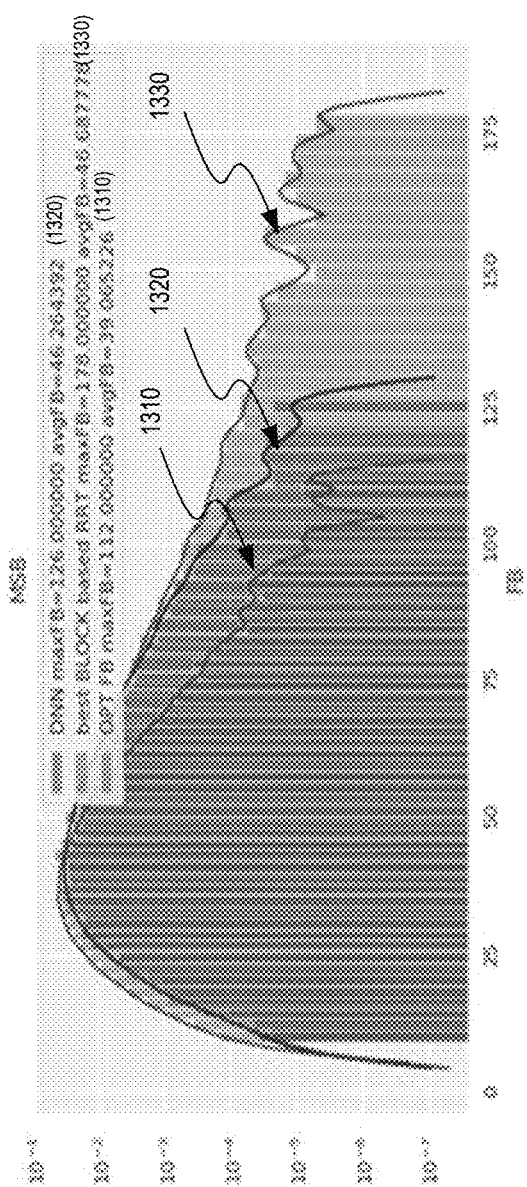
FIG. 13 illustrates a performance comparison between performance data obtained from conventional read thresholds, theoretical optimal read thresholds, and optimal read threshold obtained using the deep neural network engine.

FIG. 13 illustrates an example comparison plot for performance data obtained from conventional read thresholds, theoretical optimal read thresholds, and optimal read threshold obtained using the deep neural network engine. The vertical axis indicates a codeword failure rate, and the horizontal axis indicates the number of failure bits. The narrowest curve (1310) can be obtained under the theoretical optimal conditions, and the widest curve (1330) indicates the case of read retry threshold based on the data of several blocks. The curve (1320) between these two curves (1310 and 1330) can be obtained by using the deep neural network engine based on operating conditions including endurance of memory device, data retention, read disturbance, age of the memory device, operating temperature of the memory device, and a location of a memory cell to be read. As can be seen in example comparison plot of FIG. 13, the result obtained using the deep neural network engine implemented based on an embodiment of the disclosed technology shows a max failure bit of 126 and an average failure bit of 46, which is closer to the ideal case.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "processor" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

Only a few implementations and examples are described and other implementations, enhancements and variations can be made based on what is described and illustrated in this patent document.

What is claimed is:

1. A computer-implemented method for optimizing read thresholds of a memory device using a deep neural network engine, comprising:
reading, using a set of read threshold voltages applied to the memory device, data from the memory device under a first set of operating conditions that contribute to read errors in the memory device;
producing a labeled training data set using the set of read threshold voltages under the first set of the operating conditions;
determining, based on characteristics of the memory device, a number of layers, a size of each layer, and a number of input and output nodes of the deep neural network engine;
training the deep neural network engine using the labeled training data set; and
using the trained deep neural network engine to compute read thresholds voltage values under a second set of operating conditions,
wherein the first set of operating conditions includes a location of a memory cell to be read, and wherein a number of program and erase operations associated with the location of the memory cell is obtained prior to said reading by a memory controller.

2. The method of claim 1, wherein the first set of operating conditions further includes at least one of endurance of memory device, data retention, read disturbance, age of the memory device, or operating temperature of the memory device.

3. The method of claim 1, wherein the location of the memory cell includes die indices, block indices, and word line indices.

4. The method of claim 1, wherein a number of the first set of operating conditions is smaller than a number of the second set of operating conditions.

5. The method of claim 1, wherein the first set of the operating conditions includes discrete values selected out of continuous values of the operating conditions.

6. The method of claim 1, wherein the layers and input and output nodes of the deep neural network engine include at least two layers, N input nodes, and M output nodes, where N is the number of conditions considered and M is the number of different read threshold settings considered, where N and M are greater than or equal to 2.

7. The method of claim 1, wherein using the trained deep neural network engine to compute the read thresholds voltage values includes feeding the labeled training data set into the input nodes of the deep neural network engine.

8. The method of claim 7, wherein using the trained deep neural network engine to compute the read thresholds voltage values further includes obtaining optimal read thresholds from output nodes of the trained deep neural network engine.

9. The method of claim 8, wherein using the trained deep neural network engine to compute the read thresholds voltage values further includes modifying read thresholds based on the optimal read thresholds.

10. The method of claim 1, wherein a possibility of the read errors associated with the location of the memory cell increases as the number of program and erase operations performed on the location of the memory cell increases.

11. A system, comprising:
a memory to store executable instructions for optimizing read threshold voltages of memory devices in a data storage system; and
a processor in communication with the memory to read the executable instructions from the memory to:
read, using a set of read threshold voltages applied to the memory devices, data from the memory devices under a first set of operating conditions that contribute to read errors in the memory devices;
produce a labeled training data set using the set of read threshold voltages under the first set of operating conditions;
determine, based on characteristics of the memory device, a number of layers, a size of each layer, and a number of input and output nodes of the deep neural network engine;
train the deep neural network engine using the labeled training data set; and
use the trained deep neural network engine to compute read thresholds voltage values under a second set of operating conditions,
wherein the first set of operating conditions includes a location of a memory cell to be read, and wherein a number of program and erase operations associated with the location of the memory cell is obtained prior to said reading by a memory controller.

12. The system of claim 11, wherein the first set of operating condition further includes at least one of endurance of memory device, data retention, read disturbance, age of the memory device, or operating temperature of the memory device.

13. The system of claim 12, wherein using the trained deep neural network engine to compute the read thresholds voltage values further includes feeding the labeled training data set into the input nodes of the deep neural network engine.

14. The system of claim 13, wherein using the trained deep neural network engine to compute the read thresholds voltage values further includes obtaining optimal read thresholds from output nodes of the trained deep neural network engine.

15. The system of claim 14, wherein using the trained deep neural network engine to compute the read thresholds voltage values further includes modifying read thresholds based on the optimal read thresholds.

16. The system of claim 11, wherein the location of the memory cell includes die indices, block indices, and word line indices.

17. The system of claim 11, wherein a number of the first set of operating conditions is smaller than a number of the second set of operating conditions.

18. The system of claim 11, wherein the first set of operating conditions include discrete values selected out of continuous values of the operating conditions.

19. The system of claim 11, wherein the layers and input and output nodes of the deep neural network engine include at least two layers, N input nodes, and M output nodes, where N is the number of conditions considered and M is the number of different read threshold settings considered, where N and M are greater than or equal to 2.

20. The system of claim 11, wherein a possibility of the read errors associated with the location of the memory cell increases as the number of program and erase operations performed on the location of the memory cell increases.

* * * * *